United States Patent [19]

Blades

[11] Patent Number: 5,260,663
[45] Date of Patent: Nov. 9, 1993

[54] METHODS AND CIRCUITS FOR MEASURING THE CONDUCTIVITY OF SOLUTIONS

[75] Inventor: Frederick K. Blades, Boulder, Colo.
[73] Assignee: Anatel Corporation, Boulder, Colo.
[21] Appl. No.: 913,022
[22] Filed: Jul. 14, 1992
[51] Int. Cl.$^5$ ............................................. G01N 27/06
[52] U.S. Cl. ................................. 324/442; 324/439; 204/402; 204/406
[58] Field of Search ............... 204/402, 406; 324/439, 324/425, 442

[56] References Cited

U.S. PATENT DOCUMENTS

| | | | |
|---|---|---|---|
| 4,443,763 | 4/1984 | Marsoner | 324/439 |
| 4,496,454 | 1/1985 | Berger | 204/406 |
| 4,500,840 | 2/1985 | Galwey et al. | 204/406 |
| 4,683,435 | 7/1987 | Blades | 324/442 |
| 4,808,930 | 2/1989 | Kaiser | 204/406 |

*Primary Examiner*—Kenneth A. Wieder
*Assistant Examiner*—Glenn W. Brown
*Attorney, Agent, or Firm*—Michael de Angeli

[57] ABSTRACT

Improved circuits for measuring the conductivity of a solution confined between two electrodes in a cell compensate for series capacitance and parallel capacitance between the electrodes. A bipolar square-wave signal is applied to the cell. In one embodiment, the current through the cell is measured by an op-amp in current-to-voltage converter configuration. A feedback resistance employed with the op-amp in a feedback loop is controlled to a low value to ensure that the parallel capacitance is fully charged during an initial portion of each half-cycle of the drive signal. The feedback resistance is then selected so that the gain of the feedback loop is responsive to the range of the resistivity of the solution, and the measurement is made. The period of the bipolar signal is selected responsive to the selected loop gain, to ensure that a filter capacitor across the op-amp is fully charged, and to limit distortion caused by the series capacitance. More particularly, the rate of charge of the series capacitance is proportional to the solution resistance; by varying the period of the drive signal in accordance with the solution resistance, the distortion introduced by the series capacitance remains negligible.

33 Claims, 5 Drawing Sheets

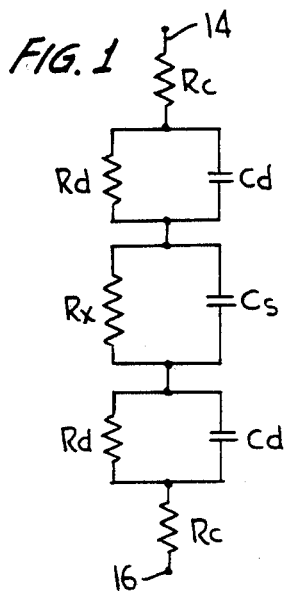
FIG.1
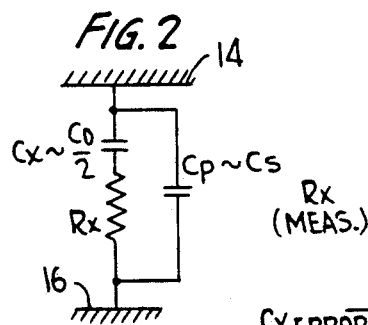
FIG.2
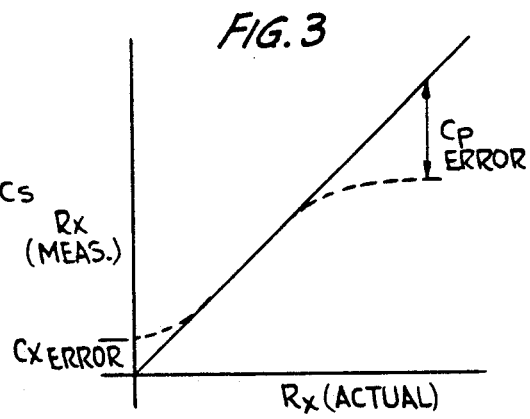
FIG.3
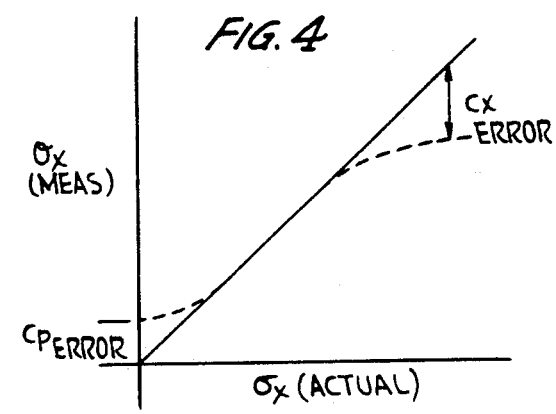
FIG.4
FIG.5
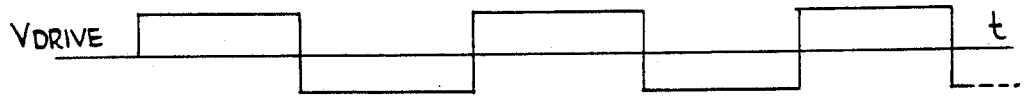
FIG.6
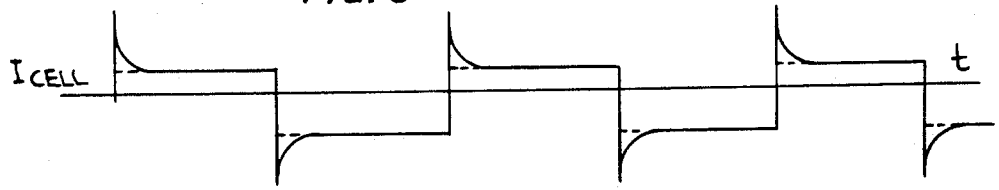
FIG.7
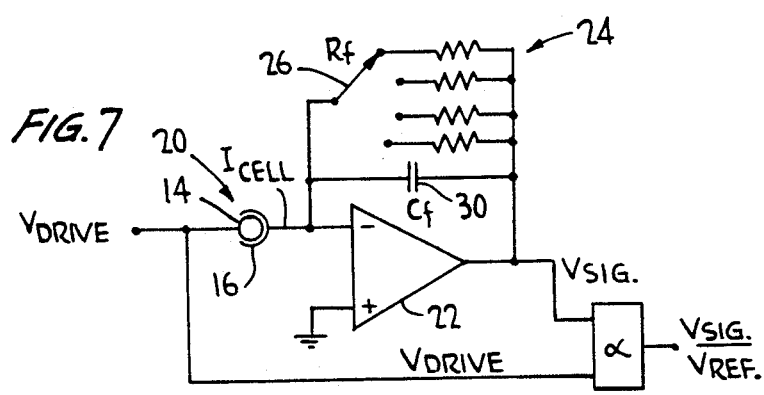

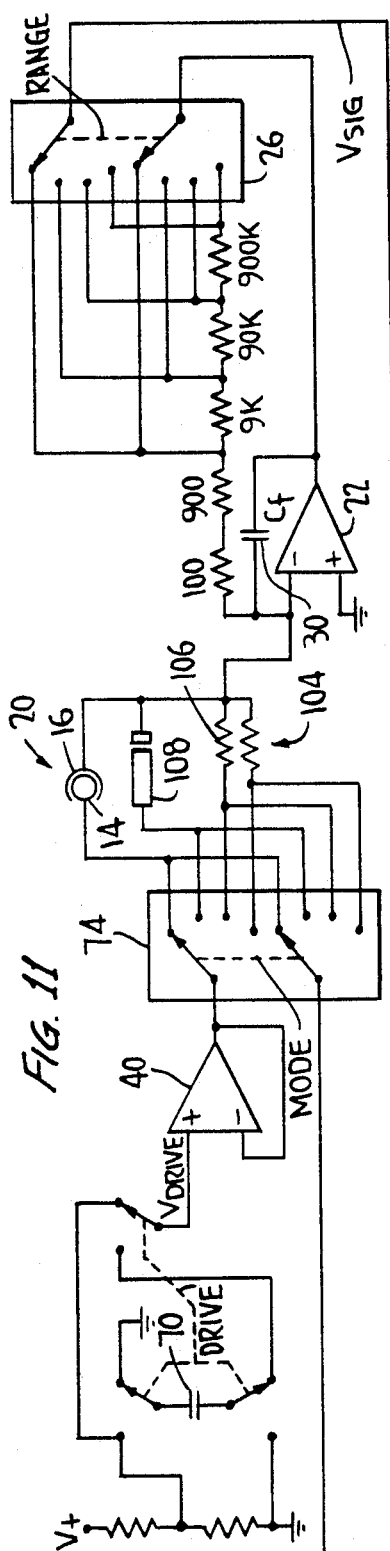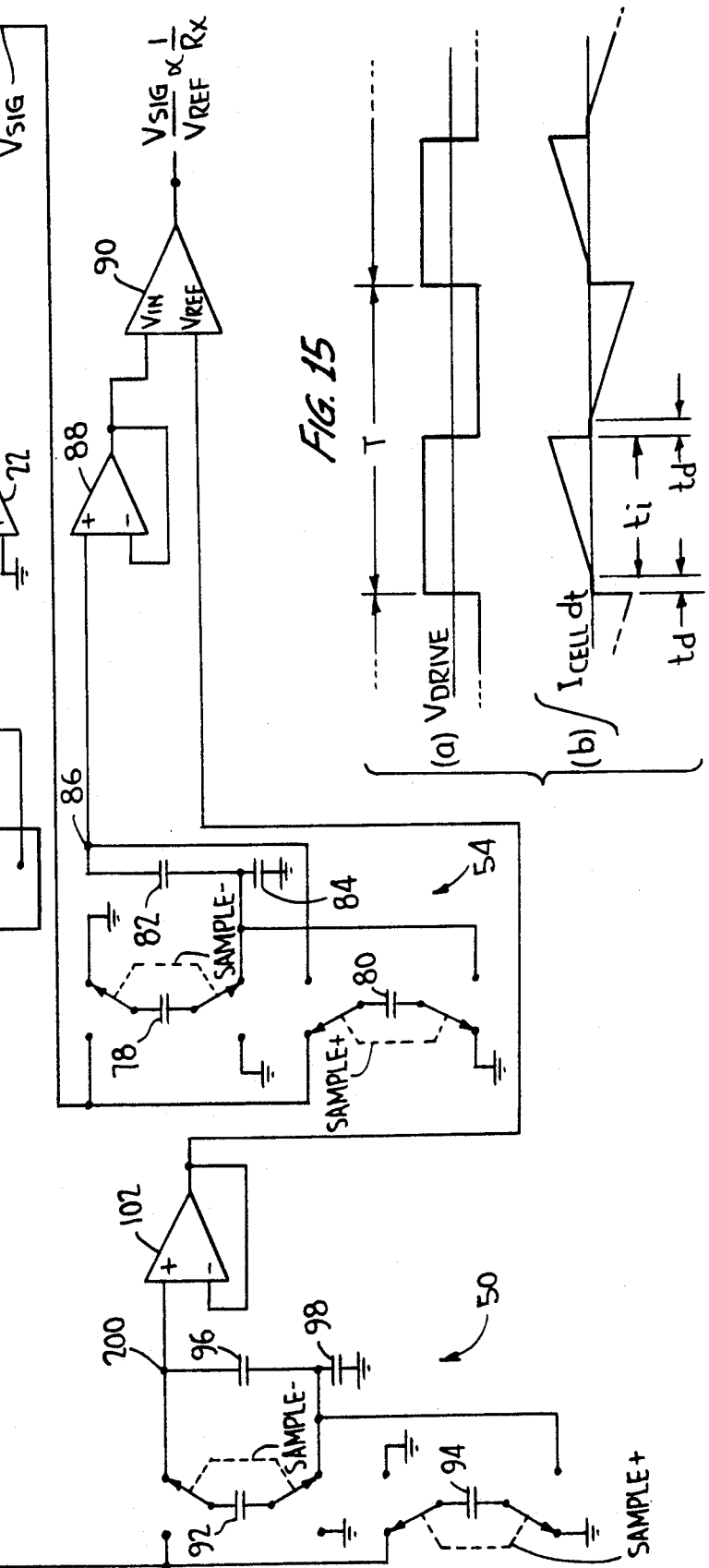
FIG. 11
FIG. 15

METHODS AND CIRCUITS FOR MEASURING THE CONDUCTIVITY OF SOLUTIONS

BACKGROUND OF THE INVENTION

1. Field of the Invention

This invention relates to a circuit for measuring the conductivity of a solution disposed between two electrodes. More particularly, this invention relates to circuits for accurately measuring the conductivities of solutions varying over several orders of magnitude, wherein inherent sources of parallel and series capacitance are accurately compensated for.

2. Description of the Prior Art

There are many applications wherein it is desired to measure the electric conductivity of a solution. The conductivity of a solution is a measure of the dissolved ionic content of the solution. In low conductivity solutions, ranging from ultra-pure water used in semi-conductor and pharmaceutical manufacturing to power plant cooling water and potable water, the conductivity is measured as an indication of ionic impurities. In higher conductivity solutions, such as process chemicals and the like, conductivity is often measured to monitor and control the addition of ionic additives. In each of these applications there is a distinct need for apparatus and methods to accurately measure the conductivity of water. Measurements of the conductivity of solutions are relevant in many other industries and applications.

The conductivity of a solution can be determined by measuring its electrical resistance. Due to the nature of ionic solutions, however, measuring this resistance with dc current will cause ion migration that can substantially affect the measurement. For this reason, ac current is generally employed, at a voltage low enough and a frequency high enough to not affect the solution during the measurement.

The volume resistivity or simply the 'resistivity' of a solution is defined as the resistance of one cubic centimeter of the solution at a specific temperature. The units of resistivity are ohm-cm ($\Omega$-cm), kilohm-cm (K$\Omega$-cm), or megohm-cm (M$\Omega$-cm). Resistivity may be measured directly by applying an alternating current $I_c$ through the cell and measuring the resulting voltage drop $V_c$ across the electrodes. The resistivity $\rho$ is then:

$$\rho = V_c / K I_c$$

where:

$\rho$ is the solution resistivity, in $\Omega$-cm
$I_c$ is the current applied through the cell, in amperes
$V_c$ is the voltage measured across the cell, in volts
K is the cell constant.

The volume conductivity of a solution, also known as 'specific conductance', is defined as the inverse of the resistance of one cubic centimeter of the solution at a specific temperature. The units of specific conductivity are mho/cm (also known as Seimens) and $\mu$mho/cm ($\mu$Seimens, or $\mu$S). Conductivity may be measured directly by applying an alternating voltage source $V_c$ across the cell and measuring the resulting current $I_c$ thereon. The specific conductance $\sigma$ is then:

$$\sigma = K I_c / V_c$$

where: $\sigma$ is the specific conductance, in mho/cm $V_c$ is the voltage applied across the cell, in volts
$I_c$ is the measured current through the cell, in amperes
K is the cell constant.

In either case, the basic parameter measured is the actual resistance of the solution, $R_X = V_c/I_c$. Accurate measurement of $R_X$ is complicated by the presence of a parallel capacitance $C_P$ across the cell and a series capacitance $C_X$ formed at the solution-cell interfaces.

FIG. 1 depicts an approximate equivalent circuit of the solution-electrode interface. The solution resistance of interest is depicted as $R_X$. Each electrode-solution interface forms an imperfect 'double-layer' capacitance $C_d$ with an effective series resistance $R_c$ and an effective leakage resistance $R_d$. Additionally, a capacitance $C_s$ is formed by the surface area of the electrodes 14 and 16 separated by the solution, acting as a dielectric.

FIG. 2 depicts a simplified equivalent circuit of the cell. The circuit parameter of analytical interest is $R_X$, the resistance of the solution, primarily responsive to the ions in the solution. $C_P$ is the total effective parallel capacitance existing between the two electrodes, including any cable capacitance. The value of $C_P$ is substantially proportional to the area of the electrodes and inversely proportional to the separation of the electrodes. $C_P$ typically varies from less than 100 pf to over 1000 pf depending on cell geometry. $C_X$ is the total capacitance in series with $R_X$, approximately equal to $C_d/2$, and is again a function of cell geometry, generally increasing with increasing electrode surface area. $C_X$ typically ranges from 1 to 10 pf.

FIG. 3 is a graph of the actual resistance $R_X$ (actual) of the solution in the cell versus the resistance observed $R_X$ (meas), that is, if no compensation is made for the contributions of $C_X$ and $C_P$. As $R_X$ (actual) gets lower, i.e., in a solution containing larger numbers of ions, the impedance of $C_X$ becomes a larger proportion of $R_X$ (actual) and introduces an error indicated on FIG. 3 as "$C_X$ error". As $R_X$ (actual) gets higher, in less-ionic solutions, the parallel impedance of $C_P$ progressively reduces the measured impedance and introduces the error indicated as "$C_P$ error".

FIG. 4 is a graph of the conductivity $\sigma_x = 1/R_X$ of the sample in the cell, indicating the deviation of the conductivity $\sigma_X$ (actual) from the value $\sigma_X$ (meas) of the conductivity as measured. Since $\sigma_X$ as indicated is equal to $1/R_X$, the effects of the parallel and series capacitances $C_P$ and $C_X$ are inverted as shown.

Thus a circuit for adequately measuring conductivities of solutions over a wide range of conductivity values must adequately take into account and eliminate both $C_P$ and $C_X$ as sources of inaccuracy.

An early method used in the prior art to measure solution conductance employs an AC conductance bridge, where various reactance are added to arms of the bridge to compensate $C_X$, $C_P$ or both. This method has been shown to be effective but is generally slow and requires manual operation.

Digital impedance meters are available (Model 254, Electro Scientific Industries, Inc.) that employ sine-wave excitation and synchronous phase angle detection to separate the conductance due to reactive components. Again, this method is effective but is expensive and relatively slow, and cannot be effectively automated, as would be desired.

It is desirable to use a square-wave excitation signal to drive the cell, that is, to apply a square-wave signal to one electrode of the sample cell, and measure the current through the cell to determine the resistivity of the solution, due to the ease with which precision amplitude square-waves can be generated. However, the presence of $C_P$ and $C_X$ can lead to significant linearity errors if not actively compensated for. Applicant's prior U.S. Pat. No. 4,683,435 addresses in detail one approach to compensating some of these errors while using a square-wave drive signal. The present invention reflects additional understanding of the problems inherent in measuring the conductivity of a solution confined between two electrodes in a cell and presents additional and improved solutions thereto.

OBJECTS AND SUMMARY OF THE INVENTION

It is therefore an object of the invention to provide a circuit and methods for measuring the conductivity of solutions that minimizes the effects of series and parallel capacitance inherent in cells containing samples of such solutions.

The above object of the invention and others which will appear as the discussion below proceeds are satisfied by the present invention, which comprises circuits and methods for accurately measuring the conductivity of solutions of widely varying conductivities. More particularly, it has been realized by the present inventor that entirely different techniques are desirably employed for compensating for the parallel and series capacitances $C_P$ and $C_X$, due principally to their relatively large disparity in values; $C_P$ is normally orders of magnitude smaller than $C_X$. It is an object of the invention to provide such different techniques.

As noted, it is desired to measure the conductivity of the solution by measuring current flowing through the solution responsive to an applied square-wave drive signal. The effect of the presence of $C_P$ and $C_X$ is to distort the square-wave current signal due to charge being stored over time on the capacitances 18 represented by $C_P$ and $C_X$.

It has been realized by the present inventor that if the parallel capacitance represented by $C_P$ is fully charged prior to sampling the conductivity, the presence of $C_P$ and the error produced by $C_P$ will be fully compensated. The rate of charge of $C_P$ is a function of the total equivalent series resistance through which the drive signal applied to the cell passes. This series resistance is normally the drive source resistance in parallel with the solution resistance $R_X$. However, it has been realized by the present inventor that under some circumstances, the input resistance of the current-to-voltage converter typically used to measure the resistance of the cell can contribute to the series resistance. More particularly, when the feedback resistance $R_f$ of a feedback loop employed as part of typical current-to-voltage converter is high enough to provide sufficient gain at low values of the solution conductivity, the converter will clip during charging of $C_P$, open the feedback loop, and add $R_f$ to the series resistance.

Accordingly, it is an object of the invention to set $R_f$ to a value low enough to allow $C_P$ to charge fully prior to sampling the conductivity of the cell, and thereafter controllably vary $R_f$ such that the gain of the feedback loop is appropriate for measurement of the solution conductivity.

The rate of charge of the series capacitance $C_X$ is a function of the solution resistance $R_X$ only. The effect of $C_X$ is to reduce the voltage applied across $R_X$, thus producing an error in the conductivity measurement. While this error can not be easily eliminated, it has been realized that due to the typically large value of $C_X$, the voltage $C_X$ reaches and thus the error $C_X$ produces can be reduced to a negligible level by controlling the amount of time $C_X$ can charge prior to sampling the conductivity, responsive to the solution resistance $R_X$.

It is therefore an object of the invention to provide a circuit for measuring the conductivity of a solution employing a bipolar drive signal, wherein the frequency of the drive signal is controllably varied responsive to the order of magnitude of the solution resistance, whereby the voltage reached by $C_X$ is negligibly small.

It is a more specific object of the invention to provide a circuit for measuring the conductivity of a solution wherein the parallel capacitance $C_P$ is fully charged prior to making the conductivity measurement, so that $C_P$ does not distort the measurement, and wherein the distortion introduced by $C_X$ is minimized by limiting the effect of $C_X$ at the time the measurement is made.

More specifically, a typical current-to-voltage converter employs an op-amp having a feedback resistor $R_f$ connected between its inverting (negative) input and output terminals. The noninverting (positive) input of the op-amp is connected to a circuit common potential, i.e., ground. In this standard configuration, the negative input becomes a virtual ground, exhibiting essentially zero input resistance as long as the feedback loop is closed. However, if the current into the negative input terminal exceeds the output voltage swing capability of the op-amp for a given feedback resistance, the op-amp response clips, the feedback loop opens and the feedback resistance $R_f$ becomes the effective input resistance. Another constraint on the feedback resistance $R_f$ in the current to voltage converter feedback loop is that $R_f$ must be large enough to produce the required gain during measurement of the resistance of he cell. For example, $R_f$ typically should be 1 MΩ or more for measuring the conductivity of low-conductivity, high resistivity ultrapure water solutions.

According to one object of the invention, it is desired to maintain the total drive source resistance at a low enough level to charge $C_P$ in a relatively short period of time, at the beginning of each half-cycle of the drive signal, so as to prevent charge accumulation by $C_P$ from interfering with subsequent measurement of the current through the cell. If $R_f$ is high, e.g., 100kΩ or more, during charging of $C_P$, the op-amp will not be capable of supplying sufficient feedback current, and will clip. Therefore, according to one aspect of the present invention, $R_f$ is reduced to a level low enough to cause that $C_P$ is fully charged early in each half cycle of the drive signal. $R_f$ is then increased to a value corresponding generally to the range of the resistance of the cell, in order to provide sufficient gain in the feedback loop to measure the current flowing through the cell during a latter portion of the same half-cycle. Conveniently, several discrete feedback resistances $R_{fo}-R_{fn}$ are provided to define a like number of gain ranges. After $C_P$ is fully charged, $C_P$ no longer affects the current flowing through the cell, and thus the error produced by $C_P$ is effectively compensated for.

The rate of charge of the series capacitance $C_X$ is proportional to the solution resistance $R_X$. $C_X$ produces an error in the measured current by reducing the voltage applied across $R_X$ by the amount that $C_X$ is allowed to charge in each half-cycle before the measurement is made. With a fixed frequency drive signal, the error due to $C_X$ would increase as the solution resistance decreases. Therefore, according to another aspect of the present invention, the period T of the bipolar drive signal is decreased as the solution resistance decreases, so as to limit the voltage reached by $C_X$ to within a predefined accuracy requirement. In practice, this is accomplished by using separate drive frequencies for each gain range.

The inventor has further realized that by varying the period T of the drive signal responsive to the solution resistance, maximum filtration of extraneous random noise can be readily achieved. More specifically, the sensitivity of the current-to-voltage converter to electrical noise is proportional to $R_f$, i.e., to the gain of the current-to-voltage converter. As noted, to achieve a wide range of conductance measurements, it is desirable to make $R_f$ selectable for several gain ranges, e.g., by providing several selectable feedback resistances $R_{fo}-R_{fn}$. Furthermore, if a feedback capacitor $C_f$ is added to filter noise, it is advantageous to place the feedback capacitor $C_f$ across the op-amp itself rather than across each of the resistances $R_{fn}$, in order to keep the loop stable during gain switching. With a fixed frequency drive signal, $C_f$ would be required to be small enough to be charged fully with the largest $R_f$ before the conductivity is sampled at the end of each half-cycle. Such a small $C_f$ value would allow maximum filtering only on the highest gain range. Therefore, according to a further aspect of the present invention, the filtering is made constant across all the gain ranges, i.e., the voltage that $C_f$ reaches at the sample time $t_s$ is made essentially constant, by varying the period T of the drive signal in proportion to the selected value of $R_f$. Since $C_f$ is the same for all of the $R_f$'s, the period T is effectively varied in proportion to the time constant $R_{fn}*C_f$. It will be noted that variation of T to thus ensure $C_f$ is fully charged is the same solution as described above for compensating the effects of $C_X$, thus simultaneously providing a simple and elegant solution to two problems not solved by the prior art.

It is desired to employ the circuit of the invention to monitor the conductivity of a solution juxtaposed to a source of periodic noise. For example, a mercury vapor lamp driven by a switching power supply may be disposed near the conductivity cell, in order to oxidize organic compounds in the solution to carbon dioxide. The circuit of the invention is desirably used to measure the conductivity prior to, during, and after oxidation. The amount of such organic compounds in the solution can then be calculated responsive to the change in the solution's conductivity. Noise from the lamp drive circuit interferes with the measurement. According to a further aspect of the invention, the noise can be minimized if the period of the bipolar cell drive signal is an integral multiple of the period of the lamp drive signal; in this way, the noise is averaged to zero.

In one specific embodiment of the invention, the output signal from the cell is responsive to the solution resistance $R_X$ while the effects of $C_P$ and $C_X$ and external noise thereon are minimized. The drive signal is a square-wave of variable frequency. Four overall circuit gain ranges are provided by switching between four feedback resistors $R_{fn}$ in the current-to-voltage conversion circuit. The effect of the parallel capacitance $C_P$ is minimized by selecting the lowest valued $R_{fn}$ during a first period $t_c$ of each half-cycle of the drive signal, so that $C_P$ is quickly charged. $R_f$ is then selected to provide appropriate gain for measurement of $R_X$. The conductivity is sampled during a sampling period $t_s$ at the end of each half-cycle. The effect of the series capacitance $C_X$ is minimized by changing the drive frequency for each range, such that the total voltage across $C_X$ remains below a desired error limit. Control of the drive signal frequency and the feedback resistance $R_f$ also allows the use of a single filter capacitor $C_f$ across the current-to-voltage converter to filter random noise, while maintaining the same time constant across all of the gain ranges. The effect of external periodic noise is minimized by producing all four drive frequencies by integral division of the noise signal frequency.

In a further embodiment of the invention, the output signal from the cell is again responsive to solution resistivity while minimizing the effects of $C_P$, $C_X$ and external noise. A square-wave drive signal is again applied across the cell. In this embodiment, the current through the cell is integrated each half-cycle by a feedback capacitor $C_i$ connected as a conventional current integrator. The error produced by $C_P$ is minimized by resetting the integrator for a time $t_d$ at the beginning of each half-cycle, and providing a feedback path low enough in resistance to fully charge $C_P$ during $t_d$. The current output of the op-amp is integrated by $C_i$. The voltage output of the integrator is compared to the drive voltage, and the drive voltage is made to switch polarity each time they become equal. The integration period is thus proportional to the solution resistivity. Because $C_X$ charges at a rate proportional to $R_X$, and as the drive period is also proportional to the solution resistance $R_X$, $C_X$ will charge to essentially the same level at all solution resistances. The error introduced by $C_X$ is thus a minimal, constant error that can be eliminated mathematically, if desired. Moreover, because the integration time increases in proportion to the solution resistivity, the error introduced by random noise is also inherently minimized.

BRIEF DESCRIPTION OF THE DRAWINGS

The invention will be better understood if reference is made to the accompanying drawings, in which:

FIG. 1 is an approximate circuit diagram of a solution the conductance of which is to be measured;

FIG. 2 shows schematically a simplified equivalent circuit diagram, illustrating the series resistance $R_X$, the series capacitance $C_X$, and the parallel capacitance $C_P$ of the solution of FIG. 1;

FIG. 3 shows a graph of actual resistance of a solution in a cell versus the measured resistance;

FIG. 4 is a similar diagram showing the actual conductivity of the solution in the cell versus the measured conductivity;

FIG. 5 shows a typical bipolar square wave drive signal as a function of time;

FIG. 6 shows the current passing through a solution in a cell responsive to the drive signal of FIG. 5, as a function of time;

FIG. 7 is a simplified block diagram of one circuit for measuring the conductivity of a solution in a cell according to the invention;

FIG. 11 is a detailed schematic diagram showing the circuit of FIG. 10 more fully;

FIGS. 12(a) through (f), shows certain signals occurring in operation of the circuit of FIGS. 10 and 11 in a mode of operation suitable for measuring the conductivity of a relatively highly conductive solution;

FIGS. 13(a) through (f), is a diagram similar to FIG. 12 illustrating the operation of the circuit of FIGS. 10 and 11 as used to measure the conductivity of solutions of relatively lesser conductivity;

FIG. 15 includes a diagram of a bipolar drive signal as a function of time (FIG. 15(a)), and a diagram of the output signal of an op-amp in the circuit of FIG. 14 as a function of time (FIG. 15(b))

DESCRIPTION OF THE PREFERRED EMBODIMENTS

Figure 8:
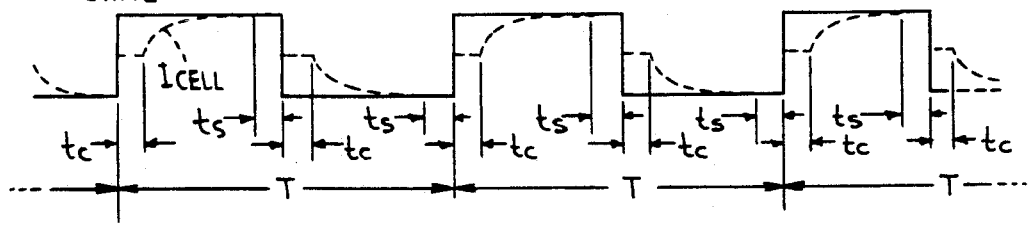
FIG. 8 is a timing diagram showing the drive signal applied to the cell and the current through the cell, and identifying certain periods during the bipolar drive signal at which various control actions are taken.

FIG. 1, as indicated above, shows an approximate equivalent circuit of a cell including electrodes 14 and 16 between which a solution the conductivity of which is to be measured is disposed. The equivalent circuit includes "double-layer" capacitances $C_d$, typically 1-10μF, formed by the electrode-solution interfaces. These capacitors exhibit an equivalent series resistances $R_c$ and leakage resistances $R_d$. $R_C$ may be on the order of 3Ω while $R_d$ is typically 200kΩ. The equivalent circuit also includes the cell capacitance $C_S$, on the order of hundreds of pf, due to the presence of the dielectric solution between the electrodes 14 and 16. The solution resistance, $R_X$, may vary widely, between <1kΩ and 100MΩ, depending on the solution, the cell design, temperature and other variables.

FIG. 2 illustrates a simplified equivalent circuit. The solution in the cell may be represented by a series resistance $R_X$ to be measured, equal to the resistivity $\rho$ of the solution times the cell constant K, or equivalently equal to K divided by the conductivity $\sigma$, a series capacitance $C_X$ essentially equal to $C_d/2$, and a parallel capacitance $C_P$ substantially equal to $C_S$. $C_P$ is effectively the capacitance existing by virtue of the opposition of electrodes 14 and 16 with the dielectric solution therebetween, $R_X$ is the resistance of the solution, varying in accordance with its ionic content, and $C_X$ is the series capacitance arising due to the presence of dual polarized layers of ions near the electrodes.

As also indicated above, FIGS. 3 and 4 show that the error due to $C_P$ primarily affects conductivity measurement of waters of high resistivity, that is, of low conductivity, while conversely the $C_X$ error becomes significant in connection with solutions of low resistivity or high conductivity. As noted, it is an object of the invention to separately and appropriately compensate these sources of measurement error.

FIG. 5 shows a typical bipolar square-wave drive signal $V_{drive}$ used to excite the cell according to the circuit of the invention. FIG. 6 shows the current $I_{cell}$ flowing through the cell responsive to $V_{drive}$, that is, without the improvement according to the invention. The characteristic exponential shape distorting the square-wave shape of $I_{cell}$ during each half of the bipolar drive signal is due to the presence of $C_P$. That is, at the beginning of each half of the bipolar drive signal $V_{drive}$, $C_P$ draws substantial current, so that the output current $I_{cell}$ is distorted until $C_P$ becomes substantially fully charged. Thereafter, the current through the cell $I_{cell}$ is essentially proportional to the total series resistance $R_S$.

FIG. 7 shows a simplified block diagram of a circuit according to one embodiment of the invention for measuring the conductivity of a solution disposed between electrodes 14 and 16 in a cell indicated generally at 20. Bipolar square-wave drive signal $V_{drive}$ of period T is applied to one electrode 14 of the cell 20. The other electrode 16 of the cell 20 is connected to the inverting (negative) input of an op-amp 22. A network 24 of selectible feedback resistances $R_{fo}-R_{fn}$ is provided with a switchable connection 26 16 such that the effective value of feedback resistance R, between the output and inverting terminals of op-amp 22 can be selected. The non-inverting terminal of the op-amp is grounded, that is, is connected to circuit common potential. As is well known, an op-amp 22 connected as shown will produce whatever output voltage (within its output voltage swing capability) is needed to drive the inputs to equality. This produces a virtual ground at the inverting input and serves as a zero-voltage current sensing point. Accordingly, the output voltage $V_{sig}$ will be proportional to $I_{cell}$; more specifically, the op-amp output voltage $V_{sig}$ will be essentially equal to the current flowing out of this node times the feedback resistance $R_f$.

According to one aspect of the invention, one of the resistances $R_{fn}$ is designed to be low enough to substantially fully charge the parallel capacitance $C_P$ existing in the cell during an initial charging portion $t_c$ of each half T/2 of the bipolar drive signal. See FIG. 8. This value of the feedback resistance may coincide with the feedback resistance used to provide the desired op-amp gain in measurement of the conductivity of solutions in the highest conductivity range. If $R_f$ is chosen appropriately, as indicated, the current through the cell due to the presence of $C_P$ reaches its final value during a charge period $t_c$, ending relatively early in each half-cycle. If the current $I_{cell}$ is sampled during a sampling period $t_s$ at the end of each half-cycle T/2 of the bipolar drive signal, the distortion caused by $C_P$ is minimized.

In practice, a filter capacitor $C_f$ 30 is placed across the noninverting input and output terminals of the op-amp 22, to filter noise. It is advantageous to place $C_f$ across the op-amp itself instead of across each feedback resistor $R_{fn}$ in order to stabilize the loop during range switching. As noted, R, is selected so that $C_P$ is substantially fully charged during an initial charge period $t_c$. At this time, $V_{sig}$ (again, the output voltage, proportional to the current $I_{cell}$ through the cell) is near zero. After $C_P$ is fully charged, $I_{cell}$ increases exponentially with a time constant $C_f * R_f$ due to the gradual charging of filter capacitor $C_f$. The time constant must be such that $I_{cell}$ reaches substantially its final value towards the end of each half cycle, that is, before the sampling time $t_s$. If T is made to vary proportionally with $R_f$, the total charge on C, a function of T/2 multiplied by the time constant $R_f * C_f$, will remain constant across the ranges provided by the resistances $R_{fn}$ to allow control of the circuit gain, as explained above. Again, the current through the cell is sampled only at a sampling time $t_s$ towards the end of each half cycle $T/2$, to ensure the current is sampled only after both $C_P$ and $C_f$ have been substantially fully charged. In this way, the value measured for the current is representative of the resistance of the solution $R_X$ in the cell.

As noted, the rate of charge of $C_P$ varies in accordance with the total series resistance $R_S$ experienced by $V_{drive}$. $R_S$ includes both $R_X$ and $R_f$ when the loop is open. The correct rate of charge of $C_P$ is controlled by control of $R_f$ in accordance with $R_f$ is Therefore, as indicated in FIG. 7, the feedback resistance $R_f$ is selectible from a series of values typically varying over four decades to ensure that the total series resistance $R_S$ experienced during the initial charging period $t_c$ is sufficiently low to ensure that $C_P$ is substantially fully charged during $t_c$. Thereafter, the feedback resistance $R_f$ may be increased to a higher value to ensure the gain of the op-amp circuit is suitably responsive to $R_X$, as above; that is, $R_f$ is selected to control the desired gain corresponding to the order of magnitude of $R_X$, so that the op-amp's output voltage is not clipped, as would occur if $R_X << R_f$, and so the output voltage $V_{sig}$ is of the same order of magnitude as $V_{drive}$.

It will be recalled from the discussion above that a series capacitance $C_X$ is also in series with the cell resistance $R_X$. As indicated above, $C_X$ is on the order of $\mu f$, as compared to $C_P$, on the order of pf. The method of compensation of $C_P$ employed according to the invention, that is, fully charging $C_P$, is not satisfactory for compensating $C_X$, as the error is proportional to the charge of $C_X$. However, it has been realized that the time constant of charging of $C_X$ is $C_X R_X$; that is, variation in $R_f$ does not affect the rate of Charge of $C_X$. The total voltage on $C_X$ at the end of each half-cycle is:

$$V_{drive}(1 - e^{-T/2R_X C_X})$$

Figure 9:
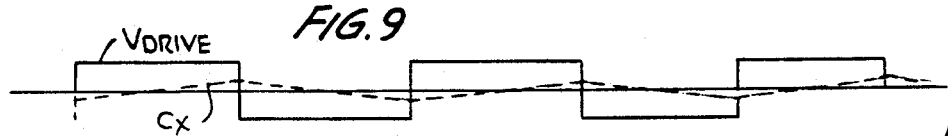
FIG. 9 is a graph showing the drive signal as a function of time, together with a further graph showing the charging of the series capacitance $C_X$ as a function of time.

Therefore, according to another aspect of the invention, the frequency of the bipolar drive signal is controlled responsive to the range of $R_X$ to ensure that $C_X$ only charges very slightly during $T/2$. The distortion contributed by $C_X$ may thereby be controlled to be beneath the accuracy target of the instrument. In one embodiment of the present invention 0.01% accuracy is required; the contribution of $C_X$ to distortion in the current through the cell can readily be controlled to be less than this value. In practice of the invention, by controlling T, as above, responsive to the range of $R_X$, the distortion introduced by $C_X$ is reduced to a negligible level and is disregarded. FIG. 9 shows an exaggerated illustration of the voltage across $C_X$ as a function of time.

Figure 10:
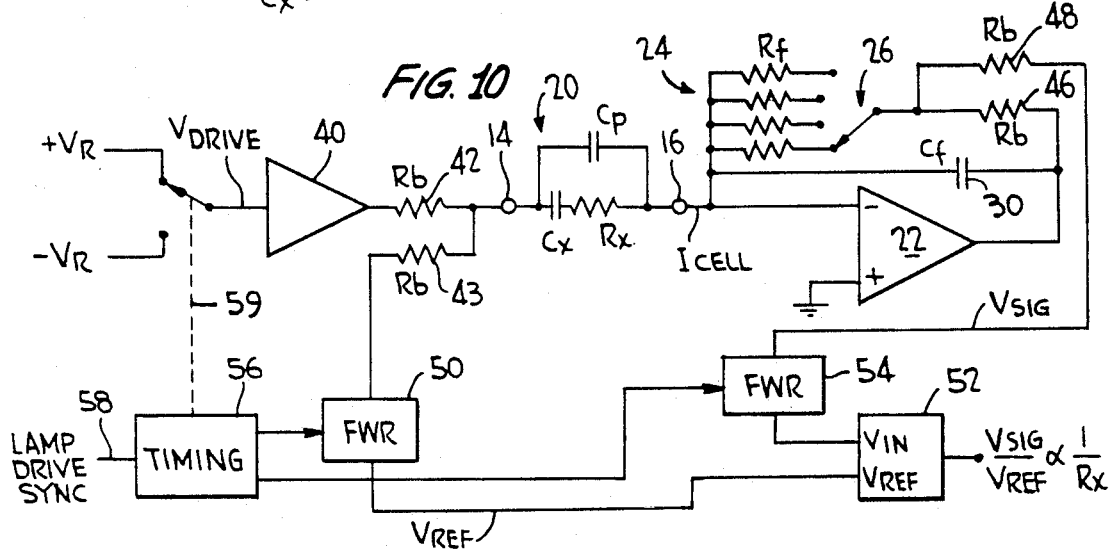
FIG. 10 is a detailed block diagram of one circuit for measuring the conductivity of a solution in a cell according to the invention.
Figure 12:
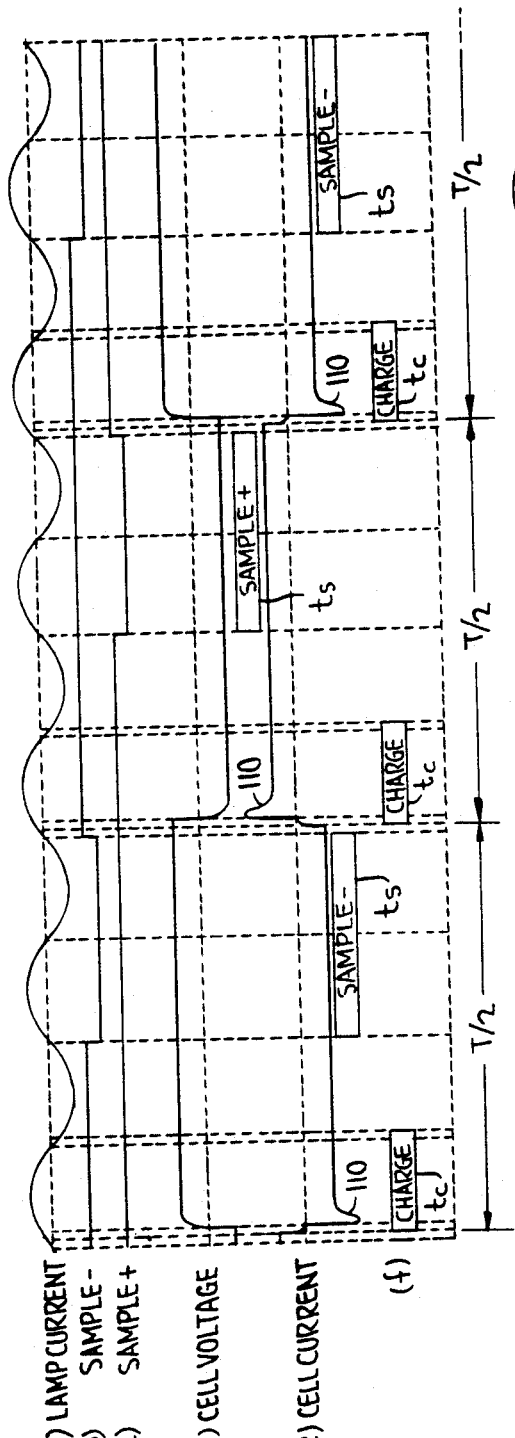
FIG. 12, comprising
Figure 13:
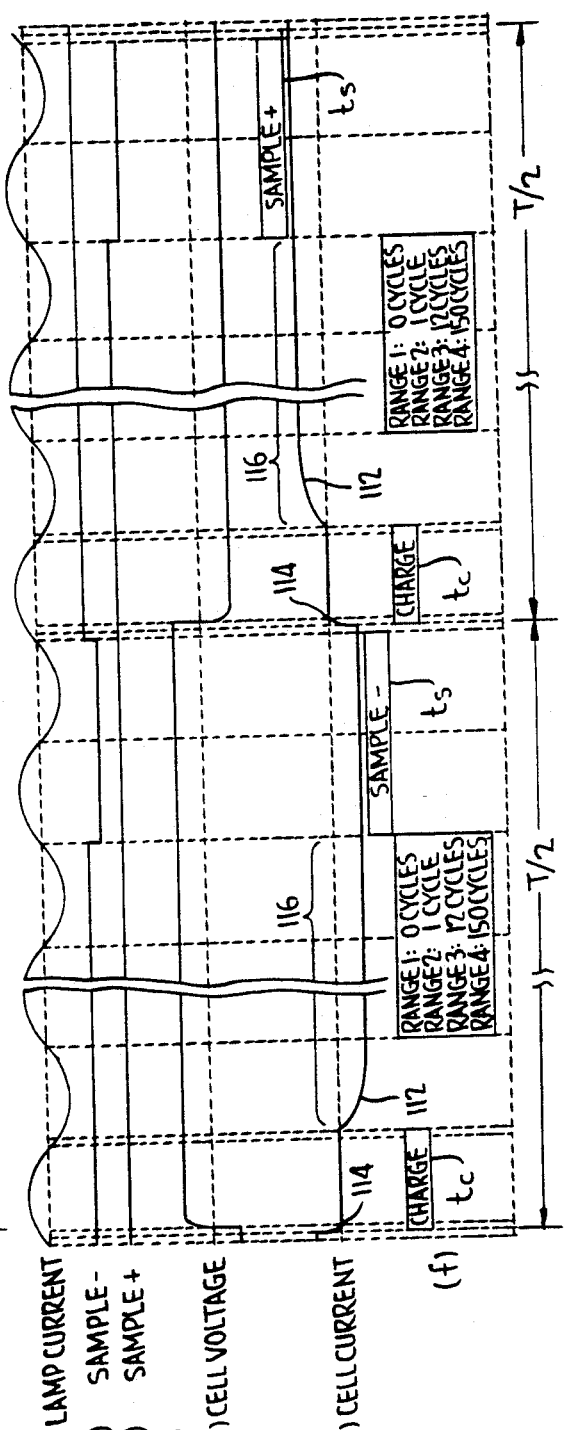
FIG. 13, comprising

FIG. 10 shows a detailed block diagram of a circuit according to the invention for measuring the conductivity of a solution in a cell corresponding to the simplified block diagram of FIG. 7. FIG. 11 shows a schematic diagram of the circuit of FIG. 10, with the components identified identically where appropriate. FIGS. 12 (a)-(f) are timing diagrams illustrating the operation of certain elements of the circuit of FIGS. 10 and 11 as employed when the conductivity of the solution is high. FIGS. 13 (a)-(f) are similar timing diagrams illustrating operation of the circuit when the conductivity of the solution is low, e.g., when the solution is ultrapure water or a similarly highly resistive solution.

Referring now to FIG. 10, the bipolar drive signal $V_{drive}$ is generated by switching between positive and negative sources of supply voltage $V_R$. The drive signal $V_{drive}$ is buffered in a buffer 40. The signal is then passed through a solid state mode switch 74 having switch resistances $R_b$ indicated at 42 and 43, for purposes discussed below, and then is supplied to one electrode 14 of a cell 20. Cell 20 effectively comprises a series capacitance $C_X$, a series resistance $R_X$ and a parallel capacitance $C_P$, all as discussed above.

The output current $I_{cell}$ flowing through the cell 20 is applied from electrode 16 to the inverting (negative) input of an op-amp 22. A filter capacitor $C_f$ 30 and a resistor network 24 for permitting switched control of the value of feedback resistance $R_f$ are connected between the inverting and output terminals of op-amp 22 in feedback configuration. Solid-state range switch 26 controls the operation of the feedback resistor network 24, and includes switch resistances $R_b$ indicated at 46 and 48, compensated for in a manner discussed below.

As indicated above, input signal $V_{drive}$ is applied to the cell 20, from which output current $I_{cell}$ is supplied to op-amp 22. As noted, op-amp 22 supplies output current as needed to drive the input terminals to equality. Since the positive input terminal is grounded, the negative input terminal is a virtual ground, and the feedback current supplied by the op-amp is the inverse of $I_{cell}$. The value of $R_f$ selected by range switch 26 at any given time controls the total series resistance $R_S$ experienced by current passing through the cell, that is, $R_f$ controls the feedback circuit gain. Thus, where the solution resistance $R_X$ is high, e.g., 1 m$\Omega$, the switched resistor network 24 is operated so that a low feedback resistance, e.g., 1k$\Omega$ is in circuit during an initial charge portion $t_c$ of each half of the bipolar drive signal. This ensures that the parallel capacitance $C_P$ is fully charged during $t_c$. Thereafter, the switched resistor network 24 is controlled to vary $R_f$ such that the total series resistance $R_S$ and hence the circuit gain are appropriate to ensure that the filter capacitor $C_F$ is fully charged during the remainder of each half $T/2$ of the bipolar drive signal $V_{drive}$ )see FIG. () prior to the sampling time $t_s$.

In order to accurately sample the signal, the drive signal $V_{drive}$ is full-wave rectified in a full-wave rectifier (FWR) 50 and supplied as the reference input $V_{ref}$ to a ratiometric analog-to-digital converter (ADC) 52. The signal input $V_{in}$ to the ADC 52 is the output voltage signal $V_{sig}$ from op-amp 22, having been similarly full wave rectified by a second full-wave rectifier 54. The output of the ADC 52 is a binary value proportional to $V_{in}$ divided by $V_{ref}$, or in this case, to the absolute value of $V_{sig}$ divided by the absolute value of $V_{drive}$. Since $V_{sig}$ is proportional to $I_{cell}$, the output of analog-to-digital converter 52 is accordingly proportional to the conductance of the solution in the cell.

The output signal from the cell $V_{sig}$ is full-wave rectified prior to the ADC 52 so that any dc bias in the circuit, e.g., due to cell chemistry, op-amp bias current and the like is automatically eliminated. The op-amp bias current through the feedback resistance $R_f$ impresses a dc bias in the output signal from the op-amp. This bias current may be of either polarity, but is of the same sign during both halves of the bipolar output signal. Therefore, when the two halves of the bipolar output signal are summed in rectification, the biases will cancel out. Similar dc bias error in the drive signal $V_{drive}$ due to switch resistance 42, or to other sources, is eliminated in full-wave rectifier 50.

In the preferred embodiment, and as discussed below in connection with FIG. 11, full-wave rectifier (FWR)

circuits 50 and 54 are implemented using flying capacitor techniques, to provide a high signal-to-noise ratio in the output signal. The flying capacitor FWR circuits are controlled by a timing network 56. One use of the circuit of the invention is in instruments for measuring the organic carbon content of water. In such instruments, the cell is desirably operated in conjunction to a source of ultraviolet radiation driven by a high frequency signal to convert any organic material in the solution to carbon. In such instruments, timing network 56 is operated in synchronization with the signal driving the ultraviolet lamp, as indicated at 58. The cell drive signal $V_{drive}$ is similarly synchronized to the lamp drive signal, as indicated at 59. More specifically, the period of the full-wave rectifier circuit control signals and the cell drive signal are controlled to be integral multiples of the period of the lamp drive signal. By thus driving the flying capacitor full-wave rectifier circuits and the bipolar cell drive signal $V_{drive}$ in synchronization with the lamp, the noise added to the output signal due to the juxtaposition of the cell to the lamp is averaged over an integral multiple of cycles of the lamp drive signal frequency, thus canceling noise due to the lamp drive signal from the output signal from the cell. In this use of the circuit of the invention, UV radiation from the lamp falls on the electrodes of the cell, also generating a dc current due to photoelectric effects. Bias from this source is eliminated by full-wave rectifying the output signal in FWR 54.

FIG. 11 shows a more detailed, substantially schematic diagram of the circuit shown in block diagram in FIG. 10. The drive signal $V_{drive}$ is generated by switching a flying capacitor 70 responsive to an input logic-level signal DRIVE between direct and inverted connections to a supply voltage V+. $V_{drive}$ is buffered in buffer 40, and then supplied to a solid state mode switch circuit 74 from which switching resistances 42, 43 (FIG. 10) arise. Mode switch 74 applies $V_{drive}$ to one of four terminals. In the position shown, corresponding to the conductivity-measuring mode, $V_{drive}$ is connected to one electrode 14 of cell 20, and to FWR circuit 50. The other electrode 16 of the cell 20 is connected to the inverting (negative) input of op-amp 22. As noted previously, filter capacitor $C_f$ 30 is placed across the inverting input and output terminals of op-amp 22, as is a resistor network 24 controlled by a further solid state range switch 26.

The output $V_{sig}$ from the op-amp 22 is connected via range switch 26 to a second set of flying capacitors 78 and 80, together comprising full-wave rectifier 54. More specifically, the output of op-amp 22 is a voltage $V_{sig}$ proportional to the current $I_{cell}$ through the cell. $V_{sig}$ is applied via range switch 26 to one of the flying capacitors C+78 and C−80 at any given time, as controlled by SAMPLE− and SAMPLE+ logic signals, shown in FIGS. 12 and 13, (b) and (c). Charge accumulated by the flying capacitors C+78 and C-80 is transferred to a corresponding pair of holding capacitors Ch+82 and Ch−84. The connections of the flying capacitors C+78 and C−80 to the holding capacitors Ch+82 and Ch−84 are respectively inverted, as shown, such that any dc bias in the stored signals is canceled, and so that the output signal between output node 86 and circuit common is precisely double the cell output signal $I_{cell}$ provided by the op-amp 22. This output signal is buffered in a buffer 88 and supplied to a comparator 90 for comparison to the rectified square-wave drive signal $V_{drive}$.

$V_{drive}$ is full-wave rectified in an FWR circuit 50 similarly comprising first and second flying capacitors 92 and 94 arranged in respectively inverting connection between holding capacitors 96 and 98, such that any dc bias in $V_{drive}$ is canceled and so that the voltage at node 100 with respect to ground is precisely twice the amplitude of $V_{drive}$. This output voltage is buffered at buffer 102 and supplied to the other input of comparator 90 for comparison to the output signal from the cell 20.

The ultimate accuracy of the circuit of FIG. 11 over its entire operating range is a function of the accuracy of the ratios of the resistors of network 24. Networks comprising resistors matched to within 0.01% of one another and providing selectible values varying over four decades are sold for use in voltmeters and the like. Such components are desirably employed as network 24. However, the absolute value of the resistors of such networks is normally not accurate to within less than about 0.1%. Therefore, a high precision calibration resistor 104 accurate to 0.01% is provided. Mode switch 74 controls the connection of the drive signal $V_{drive}$ to calibration resistor 104 (or a second calibration resistor 106), e.g., during the manufacturing operation, in lieu of connection to the cell 20, to ensure appropriate calibration.

The final terminal of mode switch 74 is connected to a thermistor 108 used for measuring the temperature of the solution in the cell, so as to appropriately compensate the conductivity value ultimately reached, e.g., to quantitatively represent a particular chemical composition of the solution.

As discussed briefly above, use of the solid state switches 74 and 26 introduces certain undefined switching resistances $R_b$ in positions illustrated in FIG. 10. The switching resistances 46 and 48 in the output circuit from the op-amp 22 are minimized by the high effective input impedance of the full-wave rectifier circuit 54 implemented by flying capacitors 78 and 80 of FIG. 11. The switching resistance $R_b$ 42 between buffer 74 and cell 20 is similarly minimized by the high impedance of the full-wave rectifier 50. In both cases, the input impedance of the flying capacitor FWR circuit 50 is very high compared to $R_b$, such that switching resistances $R_b$ do not substantially affect the overall output of the rectifier 50.

FIGS. 12 and 13 show timing diagrams useful in understanding the operation of the circuit of FIGS. 10 and 11. FIGS. 12 and 13 are substantially similar, except that FIG. 12 depicts operation of the circuit in connection with a highly conductive sample, wherein $R_f$ is itself small enough to charge $C_P$, so that $R_f$ need not be varied during T/2, while FIG. 13 refers to less conductive, more resistive solutions. FIGS. 12(a) and 13(a) each show the lamp drive signal, a simple sine wave used to drive an ultraviolet lamp juxtaposed to the conductivity measuring cell in many useful applications of the invention. In a typical application, the lamp drive signal may be 2000 volts at 30 kHz, the lamp being spaced half an inch from the electrodes of the cell. As the cell current resolution may be on the order of picoamperes, there exists a substantial potential for noise interference. If the current across the cell is sampled at an integral multiple of the lamp frequency, the lamp noise in the cell output signal will average to zero. Accordingly, as indicated in FIGS. 12(d) and 13(d) the cell voltage, i.e., the applied bipolar signal $V_{drive}$, is controlled by timing circuitry 56 (FIG. 10) to be an integral multiple of the lamp current.

As indicated, FIG. 12 shows the pertinent signals when the conductivity of the sample is relatively high, that is, when the resistivity of the sample is low, for example, in a relatively "dirty" water sample. Under such circumstances, the cell current (FIG. 12(e)) exhibits an initial relatively large excursion 110 due to the charging of $C_P$ at the beginning of each half of the bipolar cell voltage drive signal (FIG. 12(d)). In such relatively dirty waters, the feedback capacitance $R_f$ is not varied; for example, it has been found convenient to have a 1K $\Omega$ feedback resistor as $R_f$ across the op-amp 22 during the entire measurement cycle. As indicated, the cell current (FIG. 12(e)) settles relatively rapidly to its final value, as the filter capacitor $C_f$ is rapidly charged as well. The current is sampled during a sample period $t_s$, at the end of each half T/2 of the bipolar drive signal, as shown in FIG. 2(f). The sample time is controlled by logic signals SAMPLE— and SAMPLE+, applied to the flying capacitors of the full-wave rectifier circuits 50 and 54, as indicated with reference to FIG. 1.

FIG. 13 shows modification of the logic signals as the conductivity of the sample is relatively reduced, for example, in increasingly pure water. As discussed in connection with FIG. 12(b) and (c), FIGS. 13(b) and (c) denote logic signals SAMPLE— and SAMPLE+ controlling operation of the flying capacitors of full-wave rectifiers 50 and 54 to rectify $V_{drive}$ and the output signal $V_{sig}$ proportional to the current $I_{cell}$ conducted through the cell 20. The diagram of FIG. 13 includes an additional charging period 116 for charging of filter capacitor $C_F$, as shown by curve 112. That is, in the diagram of FIG. 12, no period for charging $C_F$ is shown, as FIG. 13 reduces to FIG. 12 when $R_X$ is low; when $R_X$ is low, $C_F$ charges very rapidly, and no time need be allotted for charging $C_F$. $C_P$ is charged very quickly in FIG. 13, as indicated at 114.

In FIG. 13 the legends "Range 1"-"Range 4" refer to the length of $C_F$ charging period 116. The length of $C_F$ charging period 116 is measured in cycles of the lamp current (FIG. 13(a)). "Range 1-0 cycles" in FIG. 13 refers to the timing diagram shown in FIG. 12, wherein the $C_F$ charging period 116 includes zero full cycles of the lamp signal between the charge period $t_c$ and the sample time $t_s$. Thus, in Range 1 $R_f$ remains 1K$\Omega$, sufficient to quickly charge $C_f$. In Range 2 (shown fully in FIGS. 12(a)-(f)), $C_X$ charging period 16 includes one full cycle of the lamp current, as shown; typically a 10L$\Omega$ feedback resistance $R_f$ is employed in the feedback loop during this time. In Range 3, period 116 is 12 cycles long, and a 100K$\Omega$ resistance may be employed a $R_f$ in the feedback loop. In Range 4 the length of the charging period is 150 cycles of the lamp signal, and the feedback resistance $R_f$ is 1M$\Omega$.

As indicated above, the principal reason for thus increasing the feedback resistance and correspondingly lengthening the period of the bipolar drive signal as the conductivity of the solution is reduced is to control the overall gain of the feedback loop. This is done by increasing the value of feedback resistor $R_f$. In order that the filter capacitor $C_f$ is substantially fully charged during the exponential period indicated generally at 112 in FIG. 13(e), and so that the value of $C_f$ need not be varied from range to range, $C_f$ charging period 116 is made sufficiently long, corresponding to $R_X$. This variation of T responsive to $R_X$ also ensures that the contribution of $C_X$ remains negligibly small.

Figure 14:
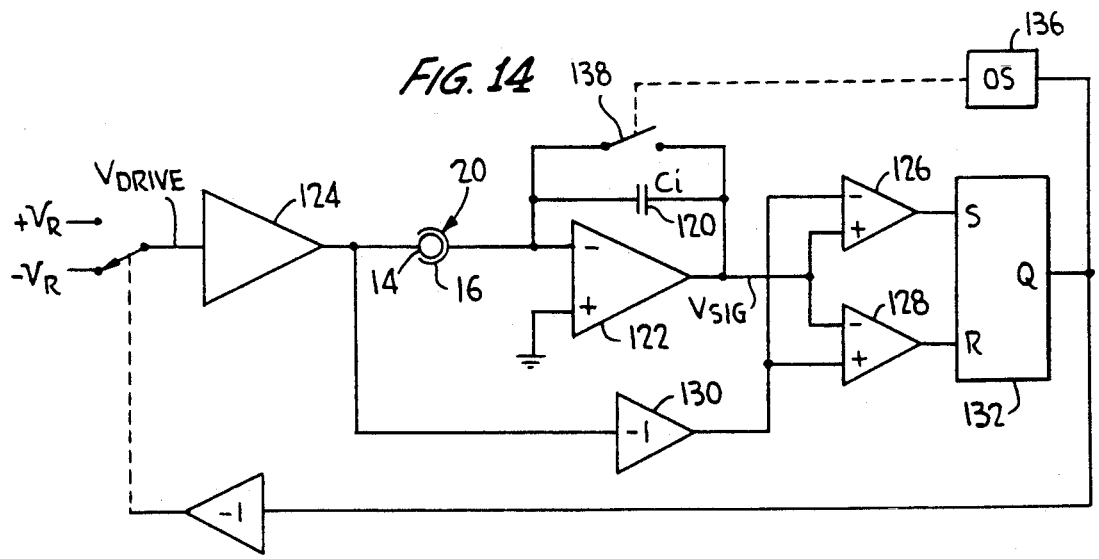
FIG. 14 is a block diagram of a circuit of a further embodiment of the invention for measuring the conductivity of a solution in a cell.

FIG. 14 shows a circuit according to a further embodiment of the invention. The circuit of FIG. 14 produces an output signal proportional to the resistance of a solution disposed between two electrodes 14 and 16 in a cell 20. In this case, the frequency of the bipolar signal $V_{drive}$ is continuously variable, controlled in accordance with the rate of charge of an integrating capacitor $C_i$ 120 connected between the inverting and output terminals of an op-amp 122. The rate of charge of capacitor $C_i$ 120 is responsive to the amount of current conducted through the cell, and thus to the conductivity of the solution. The output signal is the length of the integration period, i.e., is proportional to the time required by $C_i$ 120 to integrate to a predetermined level, and is thus proportional to the inverse of the conductivity, that is, to the solution resistivity.

In the circuit of FIG. 14, a bipolar input drive signal $V_{drive}$ is again generated by switching between positive and negative sources of potential $+V_r$ and $-V_r$, as shown. The input signal $V_{drive}$ may be generated using flying capacitor techniques as discussed in connection with FIG. 11. The bipolar drive signal $V_{drive}$ is applied via a buffer 124 to one electrode 14 of cell 20; the other electrode 16 of the cell 20 is connected to the inverting input of op-amp 122. Integrating capacitor $C_i$ 120 is connected between the inverting input and output terminals of the op-amp 122, while the non-inverting input of op-amp 122 is grounded, that is, is maintained at circuit common potential. In this circuit, and according to the operational characteristics of op-amps as mentioned above, the voltage $V_{sig}$ across capacitor $C_i$ will be proportional to the integral of the current $I_{cell}$ flowing through the cell 20.

The output $V_{sig}$ of the op-amp 122 is connected to oppositely polarized inputs of comparators 126 and 128. The input signal $V_{drive}$, having been inverted in inverter 130, is connected to the other inputs of comparators 126 and 128. Thus comparators 126 and 128 each continually compare the output signal $V_{sig}$ with the inverted value of the input signal; when either of the comparators 128 or 126 detects equality, that comparator will provide an output signal to a flip-flop 132. Flip-flop 132 then provides a Q output, connected to reverse the polarity of the bipolar drive signal $V_{drive}$. Thus the drive signal will be inverted each time the absolute value of the output $V_{drive}$ from the cell equals the absolute value of the input signal. To expand the dynamic range of $V_{sig}$, $V_{sig}$ could also be divided by any desired ratio before being compared to the input signal.

The Q output of flip-flop 132 is also supplied to a one-shot time delay 136, configured to trigger on either edge, i.e., on each transition of Q. The output of one-shot 136 controls the closing of a switch 138 which when closed discharges capacitor $C_i$ and keeps it discharged for a short period of time $t_d$ (see FIG. 15(b)) at the beginning of each half T/2 of the bipolar drive signal $V_{drive}$ (see FIG. 15(a)). In this way, the integrating capacitor $C_i$ is reset for a period of time $t_d$ during which the parallel capacitance $C_P$ across the cell 20 is permitted to be substantially fully charged, as discussed above in connection with FIGS. 10 and 11. The rate of charge of $C_P$ is proportional to the total series resistance, in this case comprising the output impedance of the buffer 124 plus the input impedance of the integrator 122. Since the reset switch 138 is closed during the reset interval $t_d$, the feedback resistance across op-amp 122 is substantially zero, allowing op-amp 122 to readily supply the current needed to charge $C_P$. Thus, in the circuit of FIG. 14, $C_P$ is allowed to become fully charged during period $t_d$ at the beginning of each half-cycle T/2 of the bipolar drive signal, while $C_i$ is being discharged, i.e., reset.

When switch 138 is opened at the end of $t_d$, beginning integration period $t_i$, capacitor $C_i$ 120 begins accumulating charge at a rate responsive to the resistance $R_X$ of the solution within the cell 20. As indicated, when the integral of the input current, i.e., is equal to the inverted value of the drive signal, the bipolar drive signal will switch polarity. More specifically:

$$V_{sig}(t) = \frac{1}{C_i} \int I_{cell} \, dt$$

Since $I_{cell}$ is constant during this period:

$$V_{sig}(t) = \frac{I_{cell}}{C_i} \int dt = \frac{I_{cell}}{C_i} \Delta t = \frac{I_{cell}}{C_i} t_i$$

where $t_i$ = integration period. Now, assuming the condition that $V_{drive} = k*V_{sig}$;

$$V_{drive}(t) = kV_{sig}(t)$$

where k is a scale factor by which $V_{sig}$ is divided before the comparison is made, and knowing:

$$I_{cell} = \frac{V_i(t)}{R_x}$$

substituting, we have:

$$V_i(t) = \frac{kV_i(t)}{R_x C_i}$$

or:

$$t_i = \frac{R_x C_i}{k}$$

Thus, $t_i$, the integration period, is proportional to the resistance $R_X$ of the cell. The proportionality constant $C_i/K$ can be adjusted as required to produce the desired integration times.

In the event the cell resistance to be measured is low, the current drawn by $C_P$ will be very small in relation to the cell current and $C_P$ can be disregarded. Accordingly, control of $t_d$ can be eliminated to reduce the overall cost of the instrument if $R_X$ can be anticipated to be very low, for example, if the instrument is to be used only to measure the conductivity of relatively dirty water.

Noting that the integration time, $t_i$, is proportional to $R_X$, as above, the voltage $V_{CX}$ to which $C_X$ is charged during this interval $t_i$ is constant. $V_{CX}$ at the end of $t_i$ is:

$$V_{CX} = V_{in}(1 - e^{t_i/R_X C_X})$$

As shown above, $t_i$ is:

$$t_i = \frac{R_x C_i}{k}$$

Substituting, we have:

$$V_{CX} = V_{in})1 - e^{R_X C_i/kR_X C_X}) = V_{in}(1 - e^{C_i/kC_X})$$

Thus, the error $V_{CX}$ due to $C_X$ is a function of the ratio of $C^1$ to $C_X$, and is not a function of $R_X$. $C_X$ therefore induces a constant offset in the output signal, which can be readily compensated for by calibration if desired, or disregarded if below the required accuracy of the instrument.

Figure 16:
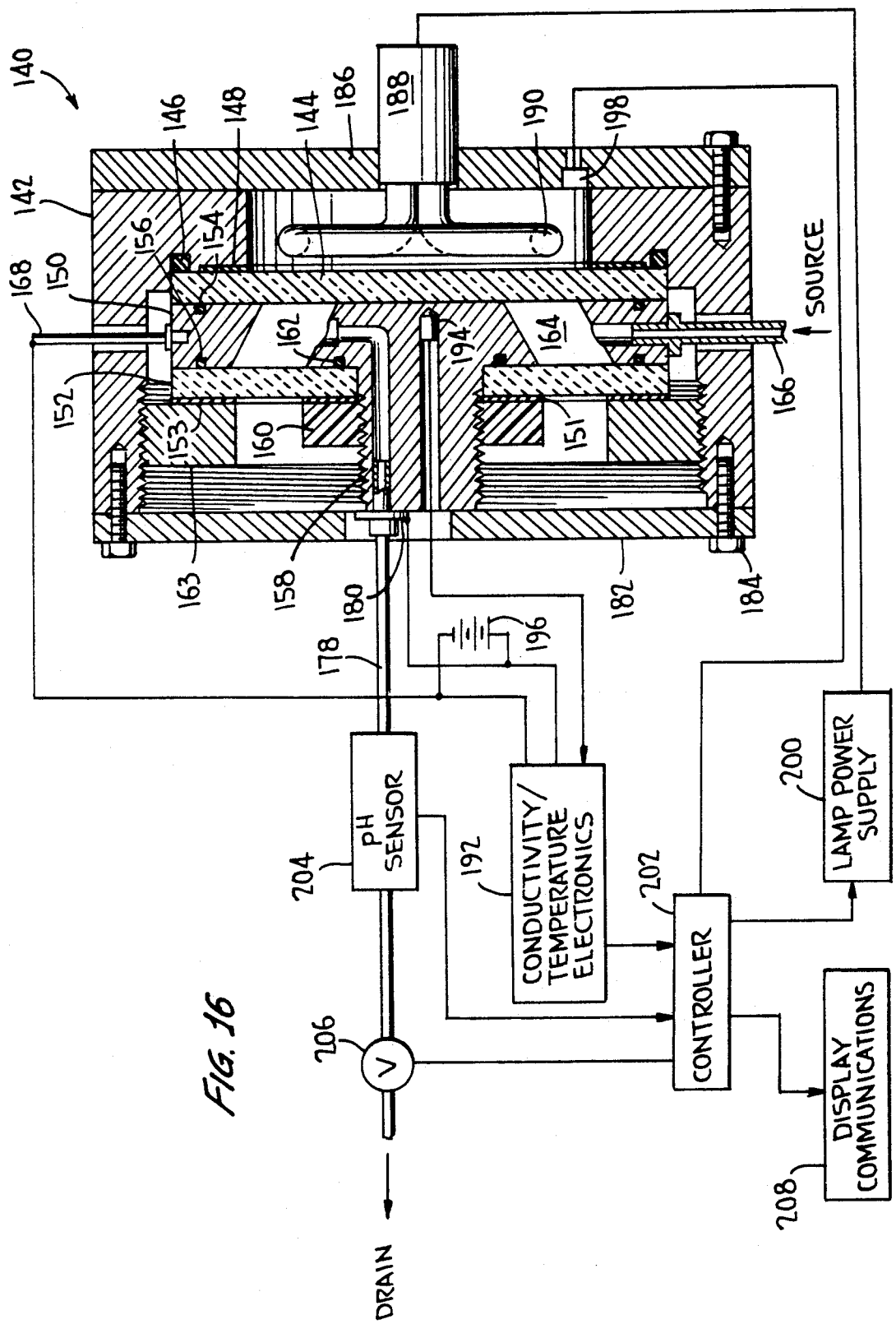
FIG. 16 is a cross-sectional view of a cell in connection with which the circuits of the invention may be useful, together with a block diagram of a complete instrument for measurement of the organic carbon content of water employing the circuit of the invention.

FIG. 16 shows a complete system for analysis of the total organic carbon (TOC) content of water employing the method and circuits of the invention to measure the conductivity of a water sample before, during and after oxidation of TOC in the water under the influence of ultraviolet radiation (UV). In this system, conductivity circuits as above are employed to measure the conductivity of water disposed in a chamber 164 formed between electrodes 150 and 158 of a cell 140. The sample exposure and analysis cell 140 comprises a body member 142 which is generally cylindrical and may be formed of aluminum. The cell body 142 has a generally cylindrical recess therein into which each of the principal components of the cell are assembled in sequence. The cell body 142 first receives a circular quartz window 144 sealed to the body 142 by an O-ring 146 and spaced therefrom by a Teflon washer 148. A circular outer electrode 150 follows, and is sealed to the quartz window 144 and a ceramic backing member 152 by O-rings 154 and 156 respectively. An inner electrode 158, also generally circular, is assembled to the ceramic backing member 152 and secured thereto by a Delrin nut 160 threaded over a stem portion of the inner electrode. A further O-ring 162 seals the inner electrode 158 to the ceramic backing member 152. An externally threaded locking ring 163 mates with an internal thread formed on the inner diameter of the body 142 of the cell to secure the assembly together. Teflon washers 151 and 153 ensure that the ceramic backing member 152 does not gall against the Delrin nut 160 or locking ring 163.

Water enters an annular chamber 164 formed between the outer electrode 150, the inner electrode 158, the quartz window 144, and the ceramic backing member 152 via a inlet fitting 166 threaded directly into the outer electrode 150. A first electrical connector 168 is similarly threaded into the outer electrode 150.

Water leaves the chamber 164 by way of a second fitting 178 threaded directly into the stem of the inner electrode 158. A second electrical connection may be secured to a washer 180 secured to the inner electrode by the fitting 178.

A rear cover member 182 is held to the body 142 of the cell 140 by screws 184. A front cover plate 186 retains an ultraviolet lamp 188. In the currently preferred embodiment, the lamp 188 includes a circular section 190 situated so that radiation from the circular section 190 of the lamp 188 illuminates the facing surfaces of the outer electrode 150 and the inner electrode 158 forming walls of the annular chamber 164. Both electrodes are formed of titanium, and their active surfaces are preferably oxidized to $TiO_2$, which is photocatalytically active when exposed to UV. Direct exposure of the active $TiO_2$ electrode surfaces to UV promotes oxidation of TOC in the water sample to carbon dioxide by a photo-catalytic reaction discussed in detail in commonly assigned issued U.S. Pat. No. 4,868,127, and also prevents the electrodes from becoming fouled with organic matter and the like.

The outer electrode 150 and the inner electrode 158 are connected to a conductivity/temperature electronics unit 192. Unit 192 includes the conductivity measuring circuits according to this invention, as well as further circuitry for compensating the measured values of the conductivity for the temperature of the water sample. The temperature of the water sample is measured by sensor 194 disposed in a recess in the inner electrode 158 in close juxtaposition to the window 144 so as to accurately detect the temperature of water within chamber 164. If desired, a dc voltage indicated schematically by a battery 196 may be impressed across the inner and outer electrodes for electrophoretic speeding of the oxidation reaction.

The conductivity values determined by unit 192 according to the invention are analyzed by a controller 202. If the TOC of a water sample (for example) is of interest, the analysis of water in the cell may be carried out by controller 202 as described in various commonly assigned issued patents, including U.S. Pat. No. 4,868,127, and in co-pending U.S. application Ser. No. 07/757,327 filed Sep. 10, 1991, and in other patents referred to therein. Controller 202 also controls valve 206, a pH sensor 204, and suitable display and communications components indicated generally at 208, as well as the lamp power supply 200. According to the present invention, controller 202 similarly provides logic signals as needed for the operation of the circuit according to the invention for measuring the conductivity of the water sample. Specifically, if the circuit of FIGS. 10 and 11 is employed, controller 202 determines the conductivity range to be employed in accordance with a particular measurement to be carried out. If a measurement carried out in range 1, for example, yields a value which is off scale in terms of the conductivity of the solution, then the controller 202 controls a change to range 2 operation, and so forth. Controller 202 also controls operation of mode switch 74 (FIG. 11) whereby the apparatus may be operated in calibration, temperature-measuring, or conductivity-measuring modes, as discussed above. Controller 202 would also make any purely mathematical compensation required; for example, $C_X$ contributes a small but consistent error to the output voltage $V_{sig}$ in the FIG. 14 circuit. This error would typically be compensated mathematically by controller 202.

Inasmuch as the present invention is subject to many variations, modifications and changes in detail, it is intended that all subject matter discussed above or shown in the accompanying drawings be interpreted as illustrative only and not be taken in a limiting sense.

What is claimed is:

1. A method for measuring the conductivity of a solution disposed between two electrodes, such that the error in said measurement produced by the conductance of a parallel capacitance $C_P$ across said electrodes is minimized, comprising the steps of:

applying a bipolar square wave drive signal having a period T across said electrodes through a series resistance $R_S$;

changing $C_P$ during a first portion $t_c$ of each half cycle T/2 of the bipolar drive signal, while maintaining $R_S$ at a sufficiently small value during $t_c$ to allow $C_P$ to charge substantially to its maximum value during $t_c$;

measuring the current conducted between said electrodes during a latter sampling time portion $t_s$ of each half cycle T/2 of the bipolar drive signal T; and determining the conductivity of the solution responsive to the current measured in said measuring step.

2. The method of claim 1, comprising the further step of generating the bipolar square wave drive signal so as to have a constant peak voltage by switching between a positive reference voltage and a negative reference voltage at a drive signal frequency.

3. The method of claim 2, comprising the further step of generating the negative reference voltage by inverting the positive reference voltage during alternate half cycles T/2 of the period T.

4. The method of claim 1, wherein said step of measuring the current conducted between the electrodes is performed by:

applying the bipolar drive signal between one electrode and a circuit common potential;

connecting the other electrode to a summing junction;

employing feedback elements to actively maintain said summing junction at said circuit common potential; and varying the value of said feedback elements during a first portion t of each half cycle T/2 of the bipolar drive signal T as needed to ensure that sufficient current is available to charge $C_P$ to substantially its maximum value during $t_c$; and performing said step of measuring the current conducted between said electrodes by measuring the voltage developed across said feedback elements and determining the conductivity of the solution responsive to said measured voltage.

5. The method of claim 4, wherein said summing junction is the negative input of an op-amp, the positive input of said op-amp being connected to circuit common potential, and said feedback elements include a feedback resistance connected between the output of the op-amp and the negative input.

6. The method of claim 5, comprising the further steps of:

providing a network of selectible discrete feedback resistors $R_{fo}-R_{fn}$ as feedback resistance, $R_{fo}$ being of sufficiently low resistance to insure $C_P$ is charged to substantially its maximum value during $t_c$;

selecting $R_{fo}$ during $t_c$ to insure $C_P$ is charged to substantially its maximum value during $t_c$; and selecting between said resistors $R_{fo}-R_{fn}$ during each half-cycle after $t_c$ to determine the circuit gain.

7. The method of claim 6, comprising the further steps of filtering the voltage developed across selectible feedback resistors $R_{fo}-R_{fn}$ by connecting a capacitance $C_F$ between the non-inverting and output terminals of the op-amp, and varying the period T of the drive signal responsive to the selected feedback resistor $R_{fn}$ such that the ratio $T/R_{fn}$ is essentially constant.

8. The method of claim 4, comprising the further step of full-wave rectifying the output signal using flying capacitors by performing the following steps:

measuring the positive half cycle of the output voltage across said feedback elements by storing charge on a first sampling flying capacitor C+ during a positive sampling time $t_s+$ of a first positive portion T/2+ of the bipolar drive signal, and transferring this charge to a first holding capacitor Ch+ during the remainder of the period T;

measuring the negative half cycle of the output voltage across said feedback elements by storing charge on a second flying sampling capacitor C− during a negative sampling time $t_s-$ of a second negative portion T/2− of the bipolar drive signal, and inverting and transferring this charge to a second holding capacitor Ch− during the remainder of the period T; and connecting the two holding capacitors Ch+ and Ch− in series such that the resulting combined voltage is the difference between the positive voltage sampled onto C+ and the negative voltage sampled onto C−, thereby canceling any dc components in the signal.

9. The method of claim 1, wherein the electrodes of said cell are physically juxtaposed to a source of a periodic noise signal, and the frequency of the bipolar drive signal is an integral multiple of the frequency of the periodic noise signal, whereby said noise signal is canceled from the average current conducted through the cell as measured.

10. The method of claim 9, comprising the further step of generating said bipolar drive signal by alternately inverting a reference voltage with respect to ground, said inverting step being performed by a switch synchronized with said noise signal.

11. The method of claim 10, wherein said step of inverting said reference voltage with respect to ground is performed employing a flying capacitor to provide stored charge for supply during one half T/2 of the bipolar drive signal.

12. A method of measuring the conductivity of a solution disposed between two electrodes in a cell, such that a cell resistance $R_X$ and a cell capacitance $C_X$ are exhibited between said electrodes, comprising the steps of:
applying a bipolar square wave drive signal of controllable period T to said electrodes, whereby the rate $dC_X/dt$ of charging of $C_X$ during each half cycle T/2 of the bipolar drive signal is proportional $R_X$;
controlling the frequency of said bipolar drive signal in accordance with the cell resistance $R_X$ such that the total charge accumulated by $C_X$ during T/2 is small;
sampling the current conducted through the cell during each half cycle T/2 of the bipolar drive signal; and
determining the conductivity $R_X^{-1}$ of the solution in the cell responsive to said sampling of the current through the cell.

13. The method of claim 12, wherein said cell further exhibits a parallel capacitance $C_P$ across said electrodes, and said method comprises the further steps of controlling the total series resistance $R_S$ experienced by said drive signal during a first portion $t_c$ of each half T/2 of the bipolar drive signal period T such that $C_P$ is charged to substantially its maximum value during $t_c$ and controlling said sampling to be performed during a latter sampling portion t of each half T/2 of the bipolar drive signal.

14. The method of claim 12, wherein said step of sampling is performed by applying the bipolar drive signal having been conducted through the cell to an inverting terminal of an op-amp, said op-amp having a controllable feedback resistance $R_f$ connected between its output and inverting terminals, such that $R_f$ is part of $R_S$, and wherein said step of controlling $R_S$ is performed by varying $R_f$.

15. The method of claim 14, comprising the further steps of providing a network of selectible discrete resistances as feedback resistance $R_f$ and selectively connecting ones of said discrete resistances as $R_f$, such that $R_f$ assumes a relatively low value at least during $t_c$, whereby $C_P$ is charged substantially to its maximum value during $t_c$, and $R_f$ assumes a relatively high value during the remainder of T/2 if $R_X$ is high, whereby the rate of charge of $C_X$ is limited.

16. The method of claim 14, wherein if $R_X$ is low, $R_f$ is controlled to remain low throughout T/2.

17. The method of claim 14, comprising the further step of full-wave rectifying the output signal provided by said op-amp by alternately applying said output signal to a pair of flying capacitors, connected such that positive and negative portions of the output signal provided by the op-amp are summed so as to cancel any dc bias therein.

18. The method of claim 17, comprising the further step of measuring the resistance of said solution by applying a voltage proportional to said full-wave rectified output signal to a signal input of a ratiometric analog-to-digital converter, full-wave rectifying said bipolar drive signal, and applying the full-wave rectified drive signal to a reference input of said analog-to-digital converter, whereby the output of said analog-to-digital converter is proportional to the resistance of said solution in said cell.

19. The method of claim 18, wherein said step of full-wave rectifying said square-wave drive signal is performed by alternately switching a reference voltage between a further pair of flying capacitors connected to invert the polarity of one half cycle of said bipolar signal with respect to said second terminal of said comparator.

20. The method of claim 12, wherein a filter capacitor $C_F$ is connected across the inverting and output terminals of said op-amp, the value of the feedback resistance $R_f$ and period T being chosen in accordance with $C_F$ such that $C_F$ is substantially fully charged during T/2 prior to said sampling portion $t_s$.

21. The method of claim 12, wherein said electrodes of said cell are juxtaposed to a source of a sinusoidal noise signal, and comprising the further step of controlling the frequency of the bipolar drive signal to be an integral divisor of the frequency of the sinusoidal noise signal, whereby said noise signal is canceled from the average current conducted through the cell.

22. The method of claim 21, comprising the further step of generating said bipolar drive signal by alternate inverting and direct connection of a supply voltage to one electrode of said cell, said inverting and direct connection step being performed by operation of a switch synchronized with said noise signal.

23. The method of claim 22, comprising the further step of employing a further flying capacitor as part of said switch, to store charge for supply during one half of the bipolar drive signal.

24. A method for measuring the conductivity of a solution disposed between two electrodes in a cell, that the error resulting from the presence of a series capacitance $C_X$ between each electrode and the solution is minimized, comprising the steps of:
applying a bipolar square wave drive signal with a controllable period T to said electrodes, wherein the rate of charge of $C_X$ during each half cycle T/2 of the drive signal is substantially proportional to the resistivity $R_X$ of the cell;
varying the period T responsive to the approximate value of $R_X$, such that the voltage drop across $C_X$ during T/2 is maintained below a desired error limit;

sampling the current conducted through the cell during each half cycle T/2 of the bipolar drive signal; and determining the conductivity of the solution in the cell responsive to said sampling of the current through the cell.

25. The method of claim 24, wherein said cell further exhibits a parallel capacitance C, across said electrodes, and said method comprises the further steps of controlling the total series resistance $R_S$ to which the drive current is applied during a first portion $t_c$ of each half T/2 of the bipolar drive signal period T, such that $C_P$ is charged to substantially its maximum value during $t_c$, and controlling said sampling to be performed during a latter sampling portion $t_s$ of each half T/2 of the bipolar drive signal.

26. The method of claim 25, wherein said step of sampling is performed by applying the bipolar drive signal having been conducted through the cell to an inverting terminal of an op-amp, said op-amp having a controllable feedback resistance $R_f$ connected between its output and inverting terminals, such that $R_f$ is part of $R_S$, and wherein said step of controlling $R_S$ is performed by varying $R_f$.

27. The method of claim 26, wherein if $R_X$ is low, $R_f$ is controlled to remain low through T/2.

28. A method for measuring the conductivity of solutions disposed between two electrodes, wherein said solutions exhibit a widely variable series resistance $R_X$, a series capacitance $C_X$ in series with $R_X$, and a parallel capacitance $C_P$ across said electrodes, comprising the steps of:

applying a controllable-frequency bipolar square-wave drive signal to one electrode;

connecting the second electrode to the inverting input of an op-amp;

grounding the noninverting input of said op-amp;

connecting a variable feedback resistance $R_f$ between the inverting input and an output of said op-amp;

determining the approximate value of $R_X$;

controlling the period T of said bipolar drive signal in accordance with the approximate value of $R_X$, such that when $R_X$ is high, T is long, and vice versa;

controlling $R_f$ to be low at least during an initial period $t_c$ of each half-cycle T/2 of the bipolar drive signal, such that $C_P$ is charged to substantially its full value during $t_c$;

controlling $R_f$ during the remainder of T/2 in accordance with the approximate value of $R_X$;

measuring the current $I_{cell}$ output by said op-amp at a sampling time $t_s$ during the latter portion of T/2; and determining the conductivity $R_X^{-1}$ response to said measurement of $I_{cell}$.

29. The method of claim 28, comprising the further step of maintaining $R_f$ at a low value throughout T/2 if $R_X$ is relatively low.

30. The method of claim 28, comprising the further step of controlling $R_f$ and T during the remainder of T/2 after $t_f$ in accordance with the approximate value of $R_X$, such that if $R_X$ is low, $R_f$ is maintained relatively low and the remainder of T/2 is controlled to be relatively short, and such that if $R_X$ is relatively high, $R_f$ during T/2 after t is maintained relatively high and the remainder of T/2 is controlled to be relatively long.

31. The method of claim 30, wherein a filter capacitor $C_F$ is connected in parallel with $R_f$, and comprising the further step of selecting $R_f$ and T to ensure that $C_F$ is substantially fully charged between the end of $t_c$ and $t_s$.

32. The method of claim 28, comprising the further step of providing $R_f$ as a network of selectible discrete resistances, and said step of controlling $R_f$ is performed by selecting ones of said discrete resistances for connection between the inverting input and output of said op-amp.

33. The method of claim 32, wherein said network of selectible discrete resistances provides a range of resistances extending over at least four decades, the discrete resistances of the network being in precise proportion to one another, and said method comprises a further calibration step including calibrating said measurement of $I_{cell}$ by substituting a known high precision resistance for $R_X$ and determining the value of $I_{cell}$ measured responsive thereto.

* * * * *